(12) United States Patent
Hsiung et al.

(10) Patent No.: US 12,426,353 B2
(45) Date of Patent: Sep. 23, 2025

(54) SEMICONDUCTOR STRUCTURE

(71) Applicant: UNITED MICROELECTRONICS CORP., Hsin-Chu (TW)

(72) Inventors: Chang-Po Hsiung, Hsinchu (TW);
Ching-Chung Yang, Hsinchu (TW);
Shan-Shi Huang, Hsinchu (TW);
Wen-Fang Lee, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/218,578

(22) Filed: Jul. 5, 2023

(65) Prior Publication Data
US 2023/0352478 A1 Nov. 2, 2023

Related U.S. Application Data

(63) Continuation of application No. 17/163,544, filed on Jan. 31, 2021, now Pat. No. 11,735,586.

(30) Foreign Application Priority Data

Dec. 31, 2020 (CN) .......................... 202011616068.4

(51) Int. Cl.
*H10D 84/82* (2025.01)
(52) U.S. Cl.
CPC ................................... *H10D 84/82* (2025.01)
(58) Field of Classification Search
CPC ............... H01L 27/085; H01L 27/0207; H01L 27/0928; H01L 27/0927; H01L 27/3223; H01L 29/0607; H01L 27/088; H01L 29/0653; H10D 8/00; H10D 8/021; H10D 8/022; H10D 8/024; H10D 8/041; H10D 8/043; H10D 8/045; H10D 8/051; H10D 8/411; H10D 84/135; H10D 84/138; H10D 84/403; H10D 84/406; H10D 84/409; H10D 84/619; H10D 84/80; H10D 84/811;
(Continued)

(56) References Cited

U.S. PATENT DOCUMENTS 7,361,955 B2  4/2008  Kao
2002/0079556 A1  6/2002  Ishikura
(Continued)

FOREIGN PATENT DOCUMENTS

JP         3719650        11/2005

*Primary Examiner* — Thanhha S Pham
(74) *Attorney, Agent, or Firm* — Winston Hsu

(57) ABSTRACT

A semiconductor structure comprises a substrate having a first well region of a first conductive type, a second well region of a second conductive type, and a junction between the first well region and the second well region. The first conductive type and the second conductive type are complementary. A plurality of first dummy structures and second dummy structures and at least a first active region are defined in the first well region by an isolation structure. The first dummy structures are adjacent to the junction and respectively comprise a first metal silicide region and a first doped region of the first conductive type and between the first metal silicide region and the first well region. The first dummy structures are between the second dummy structures and the junction. The second dummy structures respectively comprise a second metal silicide region that direct contacts the first well region.

8 Claims, 14 Drawing Sheets

(58) Field of Classification Search
CPC ...... H10D 84/859; H10D 84/82; H10D 89/10; H10D 84/83; H10D 62/102; H10D 62/116
See application file for complete search history.

(56) References Cited

U.S. PATENT DOCUMENTS

2013/0093023 A1    4/2013   Yamada
2019/0103367 A1*   4/2019   Chen ................ H01L 21/31053

* cited by examiner

SEMICONDUCTOR STRUCTURE

CROSS REFERENCE TO RELATED APPLICATIONS

This application is a continuation application of U.S. application Ser. No. 17/163,544, filed on Jan. 31, 2021. The content of the application is incorporated herein by reference.

BACKGROUND OF THE INVENTION

1. Field of the Invention

The present invention relates to semiconductor technology, and more particularly to a semiconductor structure including dummy structures.

2. Description of the Prior Art

An integrated circuit (IC) device usually includes dummy structures to increase process window and reduce process variations, and to obtain a more uniform manufacturing result. However, improperly designed dummy structures may cause device leakages and adversely impact the device performance.

SUMMARY OF THE INVENTION

One aspect of the present invention is to provide a semiconductor device having dummy structures arranged along the junctions between well regions of different conductive types. In one embodiment of the present invention, the dummy structures may respectively have a conductive region (for example, a metal silicide region) and a doped region having a conductive type complementary to the same as the well region where the conductive region is located. The doped region may increase the injection barrier for the free carriers (such as holes) formed in the conductive region to be injected into the well region, so that the through-well leakage may be reduced. In another embodiment of the present invention, the dummy structures may respectively have a dummy diffusion region and a dummy portion disposed on the dummy diffusion region and completely covering the dummy diffusion region, such that none of any conductive region (for example, a metal silicide region) may be formed in the dummy diffusion region, and therefore no free carriers may be generated and the through-well leakage may be reduced.

According to an embodiment of the present invention, a semiconductor structure is provided. The semiconductor structure comprises a substrate having a first well region of a first conductive type, a second well region of a second conductive type, and a junction between the first well region and the second well region. The first conductive type and the second conductive type are complementary. A plurality of first dummy structures and second dummy structures and at least a first active region are defined in the first well region by an isolation structure. The first dummy structures are adjacent to the junction and respectively comprise a first metal silicide region and a first doped region of the first conductive type and between the first metal silicide region and the first well region. The first dummy structures are between the second dummy structures and the first active region. The second dummy structures respectively comprise a second metal silicide region that direct contacts the first well region.

According to another embodiment of the present invention, a semiconductor structure is provided. The semiconductor structure includes a substrate comprising a first well region of a first conductive type, a second well region of a second conductive type, and a junction between the first well region and the second well region, wherein the first conductive type and the second conductive type are complementary. An isolation structure is formed in the substrate to define a plurality of first dummy diffusions and second dummy diffusions and at least a first active region in the first well region, wherein the first dummy diffusions are adjacent to the junction, the first dummy diffusions are between the second dummy diffusions and the first active region, and wherein the second dummy diffusions respectively comprise a metal silicide portion. A plurality of first dummy gates are disposed on the first dummy diffusions and completely cover the first dummy diffusions, respectively.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1, FIG. 1A, and FIG. 1B are schematic diagrams illustrating a semiconductor structure according to a first embodiment of the present invention, wherein FIG. 1 shows a top plan view of a portion of the semiconductor structure, FIG. 1A and FIG. 1B show cross-sectional views of portions of the semiconductor structure.

FIG. 2, FIG. 2A, and FIG. 2B are schematic diagrams illustrating a semiconductor structure according to a second embodiment of the present invention, wherein FIG. 2 shows a top plan view of a portion of the semiconductor structure, FIG. 2A and FIG. 2B show cross-sectional views of portions of the semiconductor structure.

FIG. 3, FIG. 3A, and FIG. 3B are schematic diagrams illustrating a semiconductor structure according to a third embodiment of the present invention, wherein FIG. 3 shows a top plan view of a portion of the semiconductor structure, FIG. 3A and FIG. 3B show cross-sectional views of portions of the semiconductor structure.

FIG. 4, FIG. 4A, and FIG. 4B are schematic diagrams illustrating a semiconductor structure according to a fourth embodiment of the present invention, wherein FIG. 4 shows a top plan view of a portion of the semiconductor structure, FIG. 4A and FIG. 4B show cross-sectional views of portions of the semiconductor structure.

FIG. 5 and FIG. 5A are schematic diagrams illustrating a semiconductor structure according to a fifth embodiment of the present invention, wherein FIG. 5 shows a top plan view of a portion of the semiconductor structure, FIG. 5A shows a cross-sectional view of a portion of the semiconductor structure.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

Figure 1:
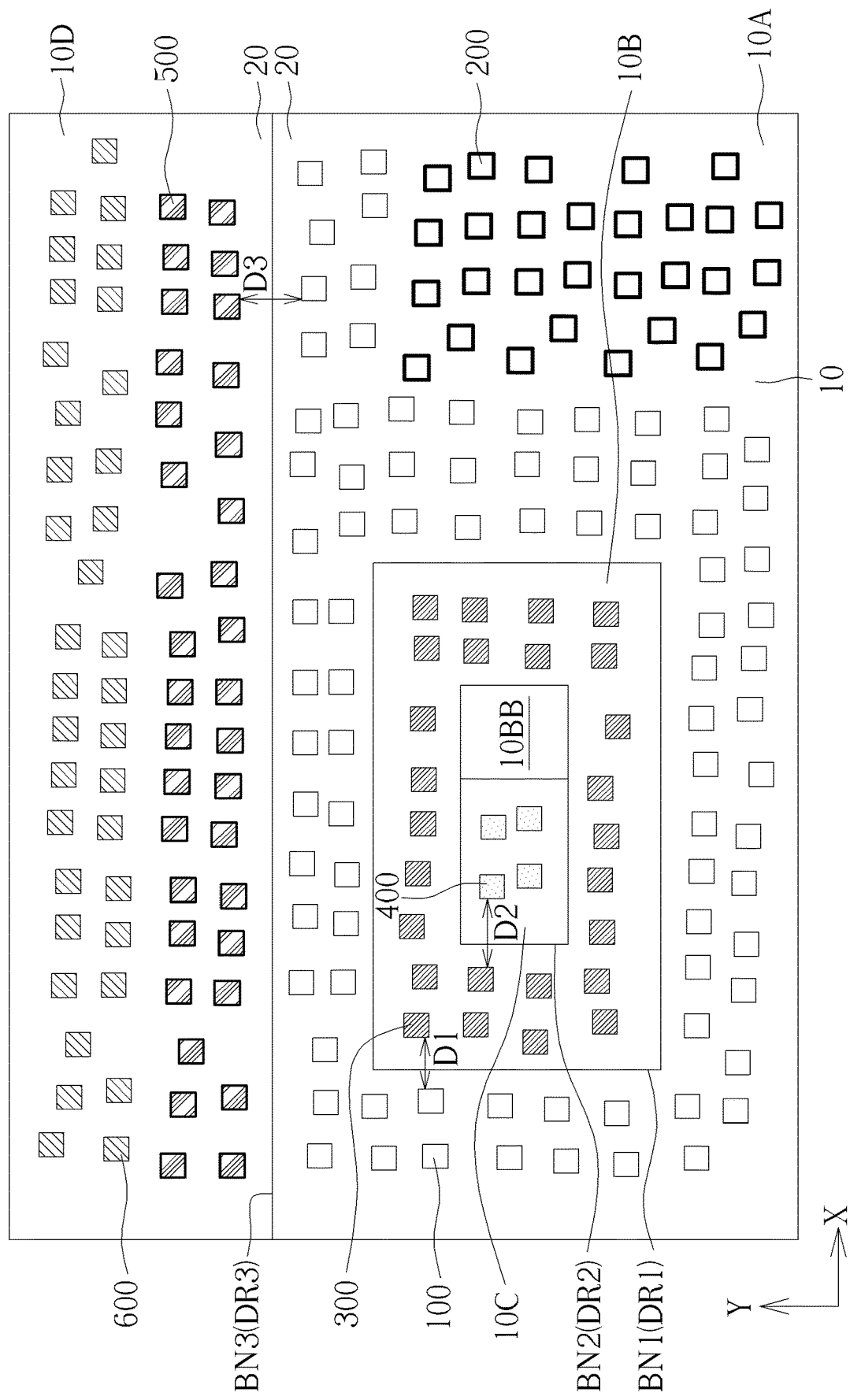
Figure 1A:
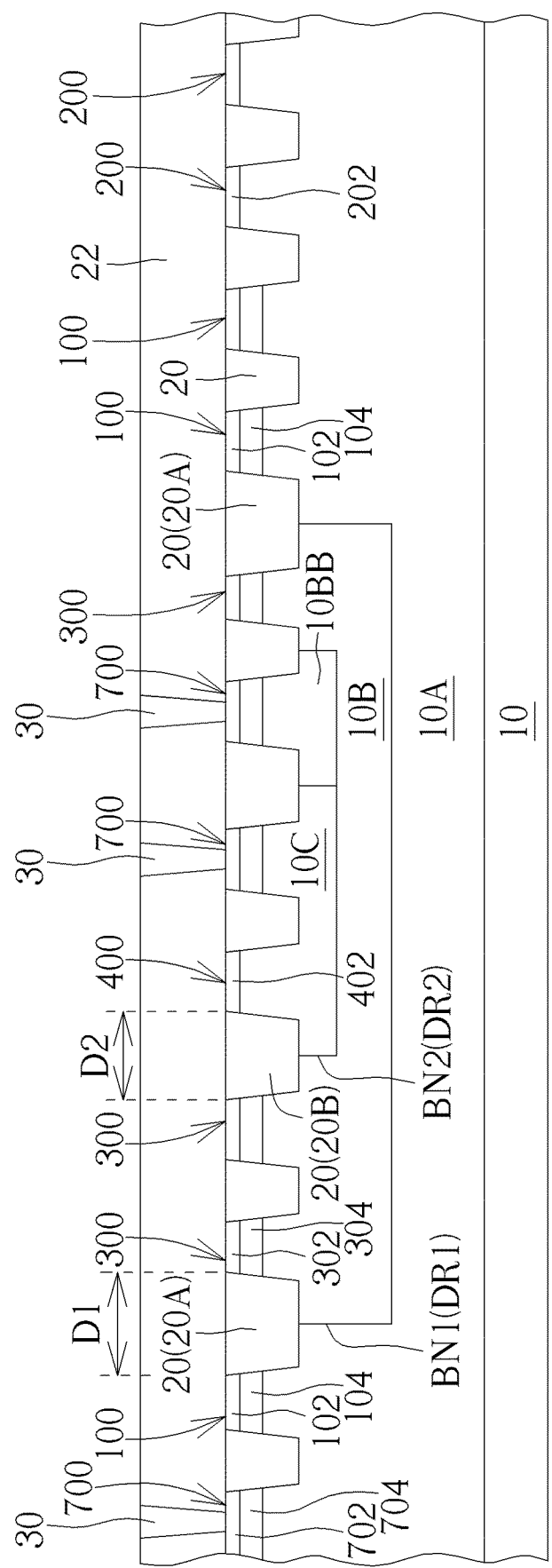
Figure 1B:
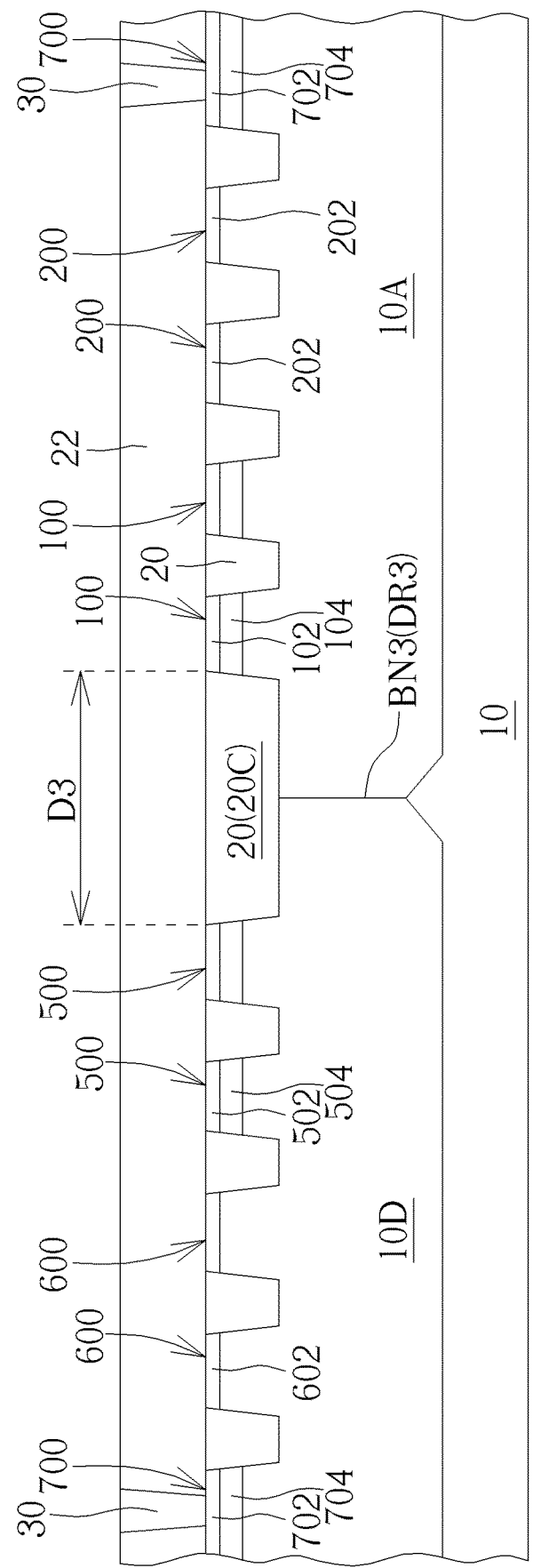

FIG. 1, FIG. 1A, and FIG. 1B are schematic diagrams illustrating a semiconductor structure according to a first embodiment of the present invention. FIG. 1 shows a top plan view of a portion of the semiconductor structure. FIG. 1A shows a cross-sectional view of a portion of the semiconductor structure along the direction X and through the first well region 10A, the second well region 10B, the third well region 10C, and the middle well region 10BB. FIG. 1B shows a cross-sectional view of a portion of the semiconductor structure along the direction Y and through the first well region 10A and the fourth well region 10D. For the sake of simplicity, some structures such as the active region 700, the interlayer dielectric layer 22, and the contact plugs 30 shown in FIG. 1A and FIG. 1B are not shown in FIG. 1.

Please refer to FIG. 1. The semiconductor structure provided by the present invention includes a substrate 10. The substrate 10 may be a silicon substrate, an epitaxial silicon substrate, a silicon-germanium semiconductor substrate, a silicon carbide substrate, or a silicon-on-insulator substrate, but is not limited thereto. A first well region 10A and a second well region 10B may be formed in the substrate 10. The first well region 10A may have a first conductive type by having dopants of the first conductive type. The second well region 10B may have a second conductive type by having dopants of the second conductive type. The first conductive type and the second conductive type are complementary. According to an embodiment, the first conductive type is P-type, and the second conductive type is N-type. In other words, the first well region 10A may be a P well, and the second well region 10B may be an N well. In some embodiments, the second well region 10B may be a deep-N well. According to an embodiment, the second well region 10B is completely within the first well region 10A, and has the side surface and bottom surface being in direct contact with the first well region 10A and encompassed by the first well region 10A. Because of complementary conductive types between the first well region 10A and the second well region 10B, a depletion region DR1 may be formed along the junction BN1 between the first well region 10A and the second well region 10B. It should be understood that the width of the depletion region DR1 may be influenced by the concentrations of the dopants in the first well region 10A and the second well region 10B, and may also be influenced by the electric fields of the first well region 10A and the second well region 10B. For the sake of simplicity, the width of the depletion region DR1 is not shown in the diagrams. According to an embodiment, the substrate 10 may have the first conductive type, such as the P-type.

According to an embodiment of the present invention, the semiconductor structure may include a plurality of first dummy structures 100 disposed in the first well region 10A and near the second well region 10B. Preferably, the first dummy structures 100 are arranged along the junction BN1 between the first well region 10A and the second well region 10B, and the first dummy structures 100 surround the second well region 10B.

According to an embodiment of the present invention, the semiconductor structure may include a plurality of second dummy structures 200 disposed in the first well region 10A and located farther from the second well region 10B than the first dummy structures 100. In other words, at least a portion of the first dummy structures 100 may be located between the second dummy structures 200 and the second well region 10B.

According to an embodiment of the present invention, the semiconductor structure may include a third well region 10C and a middle well region 10BB disposed in the second well region 10B. The third well region 10C may have the first conductive type (such as P-type) by having dopants of the first conductive type. The middle well region 10BB may have the second conductive type (such as N-type) by having dopants of the second conductive type. According to an embodiment of the present invention, the third well region 10C and the middle well region 10BB are adjacent to each other, and both are completely within the second well region 10B. The surrounding surfaces and bottom surfaces of the third well region 10C and the middle well region 10BB are encompassed by the second well region 10B and are in direct contact with the second well region 10B. Because of the complementary conductive types between the second well region 10B, the middle well region 10BB and the third well region 10C, a depletion region DR2 may be formed along the junction BN2 between the second well region 10B, the middle well region 10BB and the third well region 10C. It should be understood that the width of the depletion region DR2 may be influenced by the concentrations of the dopants in the third well region 10C, the second well region 10B, and the middle well region 10BB, and may also be influenced by the electric fields of the third well region 10B, the second well region 10B, and the middle well region 10BB. For the sake of simplicity, the width of the depletion region DR2 is not shown in the diagrams.

According to an embodiment of the present invention, the semiconductor structure may include a plurality of third dummy structures 300 disposed in the second well region 10B, and a plurality of fourth dummy structures 400 disposed in the third well region 10C. The third dummy structures 300 are arranged between the junction BN1 and the junction BN2 and are arranged at one side of the first dummy structures 100 along the junction BN1. In other words, the third dummy structures 300 and the first dummy structures 100 are at two sides of the junction BN1. According to an embodiment of the present invention, the third dummy structures 300 may surround a portion of the third well region 10C along a portion of the junction BN2, and may also surround a portion of the middle well region 10BB.

According to an embodiment of the present invention, the semiconductor structure may include a fourth well region 10D disposed in the substrate 10 and adjoining the first well region 10A. The fourth well region 10D may have the second conductive type (such as N-type) by having dopants of the second conductive type. In other words, the fourth well region 10D is an N-well region. Because of the complementary conductive types between the first well region 10A and the fourth well region 10D, a depletion region DR3 may be formed along the junction BN3 between the first well region 10A and the fourth well region 10D. It should be understood that the width of the depletion region DR3 may be influenced by the concentrations of the dopants in the first well region 10A and the fourth well region 10D, and may also be influenced by the electric fields of the first well region 10A and the fourth well region 10D. For the sake of simplicity, the width of the depletion region DR3 is not shown in the diagrams.

According to an embodiment of the present invention, the semiconductor structure may further include a plurality of fifth dummy structures 500 arranged in the fourth well region 10D and adjacent to the first well region 10A, and preferably along the junction region BN3 between the fourth well region 10D and the first well region 10A.

According to an embodiment of the present invention, the semiconductor structure may further include a plurality of sixth dummy structures 600 disposed in the fourth well region 10D and located farther from the first well region 10A than the fifth dummy structures 500. In other words, the fifth dummy structures 500 are located between the sixth dummy structures 600 and the first well region 10A.

Please refer to FIG. 1A and FIG. 1B. The first dummy structures 100 respectively include a first conductive region 102 and a first doped region 104 located under the first conductive region 102. The first doped region 104 is located between the first conductive region 102 and the first well region 10A, so that the first conductive region 102 does not directly contact the first well region 10A. According to an embodiment of the invention, the first conductive region 102 includes a metal silicide, such as cobalt silicide (CoSi), titanium silicide (TiSi), nickel silicide (NiSi), or platinum silicide (PtSi), but is not limited thereto. The first doped region 104 may include dopants of the first conductive type and therefore has the first conductive type (such as P-type) as the first well region 10A. The doping concentration of the first doped region 104 may be greater than the doping concentration of the first well region 10A.

The second dummy structures 200 respectively include a second conductive region 202 that is in direct contact with the first well region 10A. According to an embodiment of the invention, the second conductive region 202 includes a metal silicide, such as cobalt silicide (CoSi), titanium silicide (TiSi), nickel silicide (NiSi), or platinum silicide (PtSi), but is not limited thereto.

The third dummy structures 300 respectively include a third conductive region 302 and a third doped region 304 located under the third conductive region 302. The third doped region 304 is located between the third conductive region 302 and the second well region 10B, so that the third conductive region 302 does not directly contact the second well region 10B. According to an embodiment of the invention, the third conductive region 302 includes a metal silicide, such as cobalt silicide (CoSi), titanium silicide (TiSi), nickel silicide (NiSi), or platinum silicide (PtSi), but is not limited thereto. The third doped region 304 may include dopants of the second conductive type and therefore has the second conductive type (such as N-type) same as the second well region 10B. The doping concentration of the third doped region 304 may be greater than the doping concentration of the second well region 10B.

The fourth dummy structures 400 respectively include a fourth conductive region 402 that is in direct contact with the third well region 10C. According to an embodiment of the invention, the fourth conductive region 402 includes a metal silicide, such as cobalt silicide (CoSi), titanium silicide (TiSi), nickel silicide (NiSi), or platinum silicide (PtSi), but is not limited thereto.

The fifth dummy structures 500 respectively include a fifth conductive region 502 and a fifth doped region 504 located under the fifth conductive region 502 and between the fifth conductive region 502 and the fourth well region 10D, so that the fifth conductive region 502 does not directly contact the fourth well region 10D. According to an embodiment of the invention, the fifth conductive region 502 includes a metal silicide, such as cobalt silicide (CoSi), titanium silicide (TiSi), nickel silicide (NiSi), or platinum silicide (PtSi), but is not limited thereto. The fifth doped region 504 may include dopants of the second conductive type and therefore has the second conductive type (such as N-type) same as the fourth well region 10D. The doping concentration of the fifth doped region 504 may be greater than the doping concentration of the fourth well region 10D.

The sixth dummy structures 600 respectively include a sixth conductive region 602 that is in direct contact with the fourth well region 10D. According to an embodiment of the invention, the sixth conductive region 602 includes a metal silicide, such as cobalt silicide (CoSi), titanium silicide (TiSi), nickel silicide (NiSi), or platinum silicide (PtSi), but is not limited thereto.

Please continue to refer to FIG. 1A and FIG. 1B. The semiconductor structure may further include a plurality of active regions 700 respectively disposed in the first well region 10A, the middle well region 10BB, the third well region 10C, and the fourth well region 10D. According to an embodiment of the present invention, the active regions 700 may respectively include a conductive region 702 and a doped region 704 located under the conductive region 702. The doped region 704 is located between the conductive regions 702 and the first well region 10A, the middle well region 10BB, the third well region 10C, and the fourth well region 10D, so that the conductive regions 702 of the active regions 700 would not directly contact the first well region 10A, the middle well region 10BB, the third well region 10C, and the fourth well region 10D.

The doped regions 704 may respectively include dopants to have a first conductive type or a second conductive type, depending on the applications of the doped regions 704. For example, in some embodiments, when an active region 700 is used as a well-pick up or a substrate bias contact region, the conductive type of the doped region 704 of the active region 700 may be the same as the well region where the active region 700 is located. For example, the doped region 704 located in the first well region 10A may have the first conductive type (such as P-type); the doped region 704 located in the middle well region 10BB may have the second conductive type (such as N-type); the doped region 704 located in the third well region 10C may have the first conductive type (such as P type); the doped region 704 located in the fourth well region 10D may have the second conductive type (such as N type), and the doping concentrations of each doped regions 704 may be greater than the doping concentration of the well region where the doped region 704 is located. In other embodiments, when the active region 700 is used as a source/drain region, the conductive type of the doped region 704 may be complementary to the well region where the doped region 704 is located. For example, the doped region 704 in a well region having the first conductive type (for example, a P-well) may have the second conductive type (such as N-type), and the doped region 704 in a well region having the second conductive type (for example, an N-well) may have the first conductive type (such as P-type).

According to an embodiment of the present invention, the active regions 700, the first dummy structures 100, the second dummy structures 200, the third dummy structures 300, the fourth dummy structures 400, the fifth dummy structures 500, and the sixth dummy structures 600 are formed in the substrate 10 through the same manufacturing process. For example, a photolithography-etching process may be performed to form a trench (not shown) in the substrate 10 to define the patterns of the active regions 700, the first dummy structures 100, the second dummy structures 200, the third dummy structures 300, the fourth dummy structures 400, the fifth dummy structures 500, and the sixth dummy structures 600. Afterward, a dielectric layer (such as silicon oxide, silicon nitride, or silicon oxynitride, but is not limited thereto) may be formed on the substrate 10 and fill the trench. A planarization process such as a chemical mechanical polishing (CMP) process may be performed to remove overburden of the dielectric layer outside the trench and also planarize the surface of the substrate 10, thereby obtaining the isolation structure 20 formed in the substrate 10 and the active regions 700, the first dummy structures 100, the second dummy structures 200, the third dummy structures 300, the fourth dummy structures 400, the fifth dummy structures 500 separated by the isolation structure 20. By providing the dummy structures, the loading effect of the chemical mechanical polishing (CMP) process caused by different pattern densities of the active regions 700 in different areas of the substrate 10 may be reduced, so that the planarization uniformity may be improved.

As shown in FIG. 1A, the isolation structure 20 may include a first isolation region 20A disposed between the first dummy structure 100 and the third dummy structure 300 and overlapping the junction BN1 between the first well region 10A and the second well region 10B. The first distance D1 between the first dummy structure 100 and the third dummy structure 300 is approximately the width of the first isolation region 20A. The isolation structure 20 may further include a second isolation region 20B disposed between the third dummy structure 300 and the fourth dummy structure 400 and overlapping a junction BN2 between the second well region 10B region and the third well region 10C. The second distance D2 between the third dummy structure 300 and the fourth dummy structure 400 is approximately the width of the second isolation region 20B. As shown in FIG. 1B, the isolation structure 20 may further include a third isolation region 20C disposed between the first dummy structure 100 and the fifth dummy structure 500 and overlapping the junction BN3 between the first well region 10A and the fourth well region 10D. The third distance D3 between the first dummy structure 100 and the fifth dummy structure 500 is approximately the width of the third isolation region 20C.

The semiconductor structure provided by the present invention further includes an interlayer dielectric layer 22 disposed on the substrate 10 and covering the active regions 700, the first dummy structures 100, the second dummy structures 200, the third dummy structures 300, the fourth dummy structures 400, the fifth dummy structures 500, the sixth dummy structures 600, and the isolation structure 20. The interlayer dielectric layer 22 may include a dielectric material such as SiO2, SiN, SiON, or other suitable dielectric materials. A plurality of contact plugs 30 may be formed in the interlayer dielectric layer 22 and respectively electrically connected to the conductive region 702 of one of the active regions 700. The contact plugs 30 may include a conductive material, such as metal. For example, suitable metals for the contact plugs 30 may include tungsten (W), copper (Cu), aluminum (Al), titanium (Ti), tantalum (Ta), titanium nitride (TiN), and tantalum nitride (TaN), but is not limited thereto. An external voltage may be applied to the active regions 700 through the contact plugs 30 for operating the semiconductor structure.

It is noteworthy that none of the contact plugs 30 are formed on the first dummy structures 100, the second dummy structures 200, the third dummy structures 300, the fourth dummy structures 400, the fifth dummy structures 500, and the sixth dummy structures 600. That means, these dummy structures are not electrically coupled to any external voltage, and are electrically isolated from the conductive structures (not shown) on the substrate 10 by the interlayer dielectric layer 22. In other words, the first dummy structures 100, the second dummy structures 200, the third dummy structures 300, the fourth dummy structures 400, the fifth dummy structures 500, and the sixth dummy structures 600 may be electrically floating. According to an embodiment of the present invention, the first dummy structures 100, the second dummy structures 200, the third dummy structures 300, the fourth dummy structures 400, the fifth dummy structures 500, and the sixth dummy structures 600 may be completely covered by the interlayer dielectric layer 22.

In a conventional semiconductor structure, the external voltage applied to the well regions when operating the semiconductor structure may increase the width of the depletion region at the junction. Besides, process variations may cause shift of the position of the depletion region. Both of the above situations may cause the depletion region to partially overlap with the adjacent dummy structures. When the dummy structures are not designed properly, through-well leakage may occur due to the injection of free carriers into the depletion region. Furthermore, at the layout design stage of the semiconductor structure, the widths of the first isolation region 20A, the second isolation region 20B, and the third isolation region 20C need to be sufficiently large to reduce the through-well leakage. In other words, the first distance D1, the second distance D2, and the third distance D3 have to fulfill the required distances to prevent through-well leakage. This may constrain the shrinkage of the dimension of the semiconductor structure.

In order to overcome the above problems, the present invention provides a semiconductor structure having the first dummy structures 100, the third dummy structures 300, and the fifth dummy structures 500 near the junction BN1, the junction BN2, or the junction BN3 respectively provided with a doped region between the conductive region and the well region where the conductive region is formed. For example, the first doped region 104 is formed between the first conductive region 102 and the first well region 10A, the third doped region 304 is formed between the third conductive region 302 and the second well region 10B, and the fifth doped region 504 is formed between the fifth conductive region 502 and the fourth well region 10D. More important, the doped region has the same conductive type as the well region where the conductive region is formed. In this way, the doped region may modulate the band diagram near the conductive region to increase the injection barrier for the free carriers (such as holes) formed in the conductive region to be injected into the well region. Accordingly, the chance of injection of the free carriers from the first conductive region 102, the third conductive region 302, or the fifth conductive region 502 into the depletion region may be reduced, and therefore the through-well leakage may be reduced. In some cases, even the depletion region partially overlaps the dummy structures when the dimension of the semiconductor structure is shrunk, by forming the doped region in the dummy structure, the through-well leakage may be kept at an acceptable level without dramatic increase in the leakage current. Therefore, a semiconductor structure having higher layout density and smaller chip size may be achieved. According to an embodiment of the present invention, the semiconductor structure may has the first distance D1 between 1.39 um and 3.5 um, the second distance D2 between 0.98 um and 3.2 um, and the third distance D3 between 1.6 um and 4.6 um.

It should be noted that the fourth dummy structure 400 shown in FIG. 1, FIG. 1A and FIG. 1B having no doped region formed between the fourth conductive region 402 and the third well region 10C is only an example. In other embodiments, a doped region may be formed between the fourth conductive region 402 and the third well region 10C according to process need.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 2:
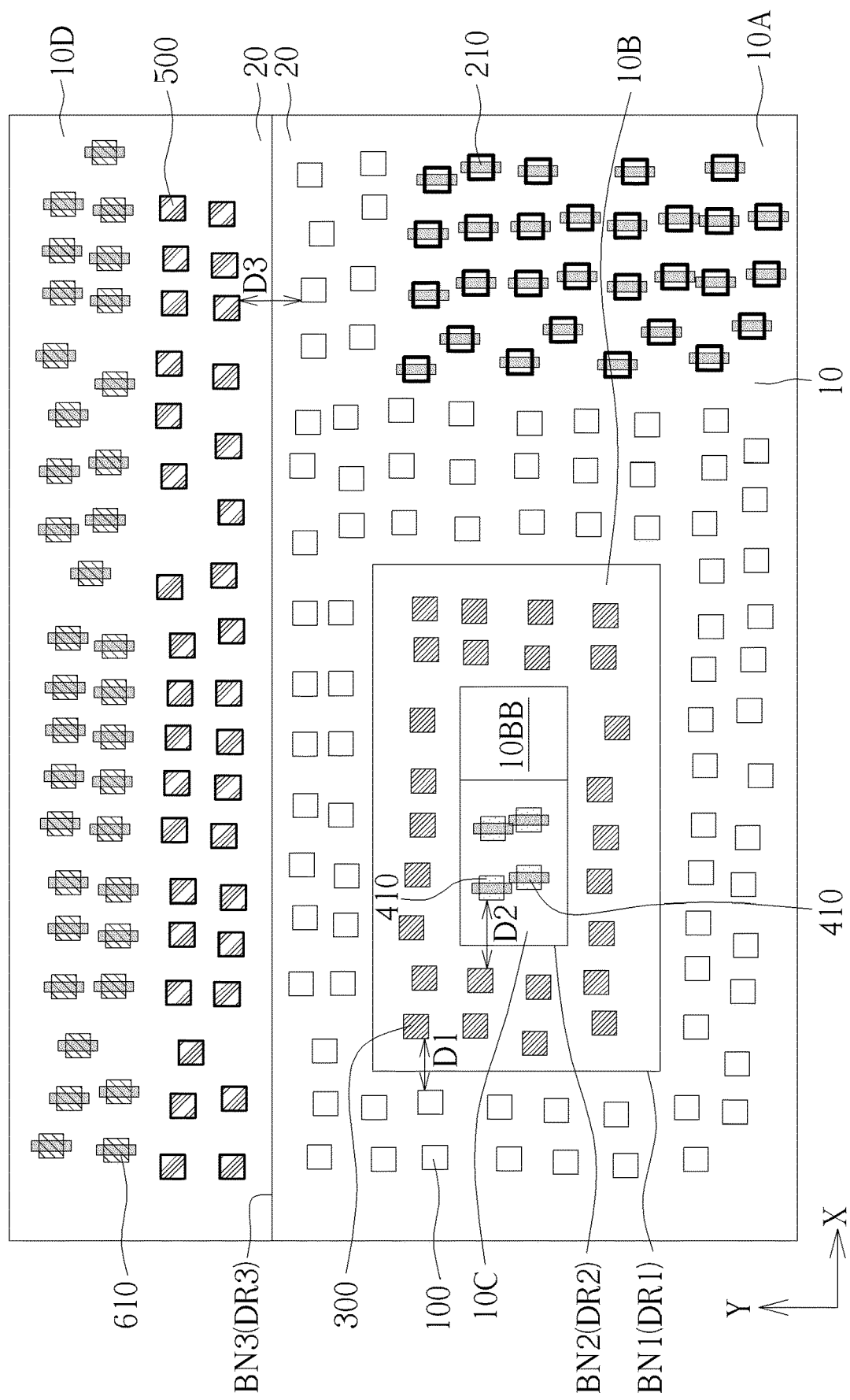
Figure 2A:
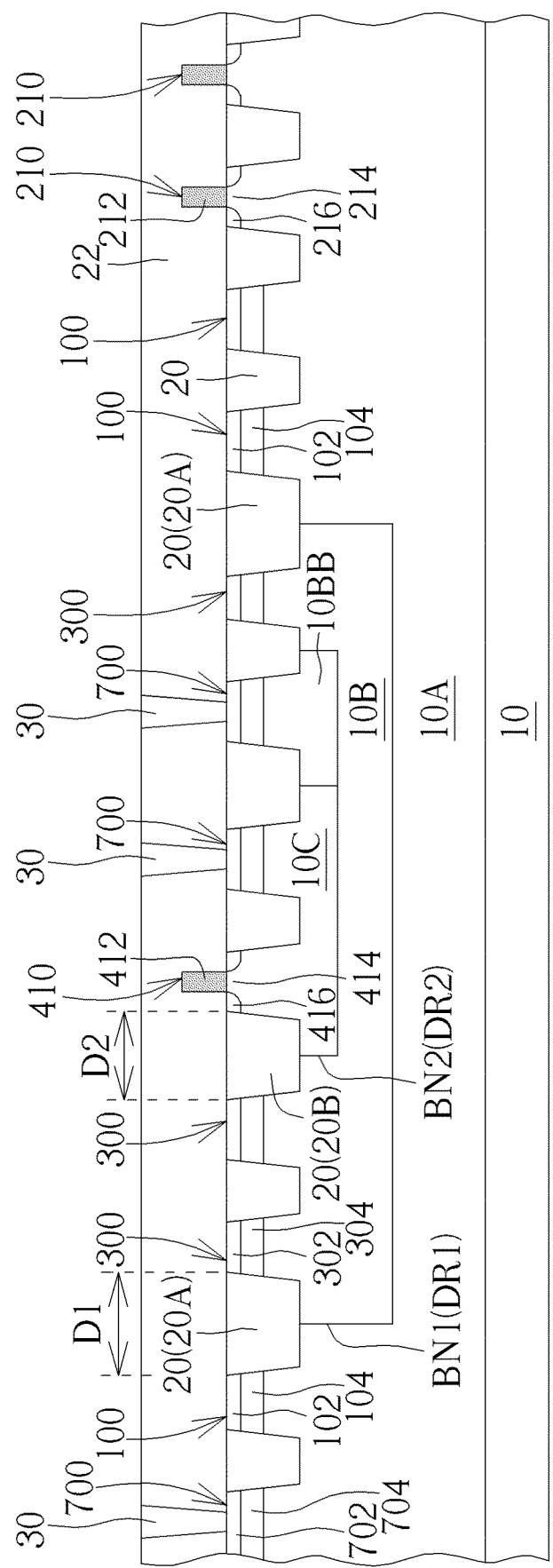
Figure 2B:
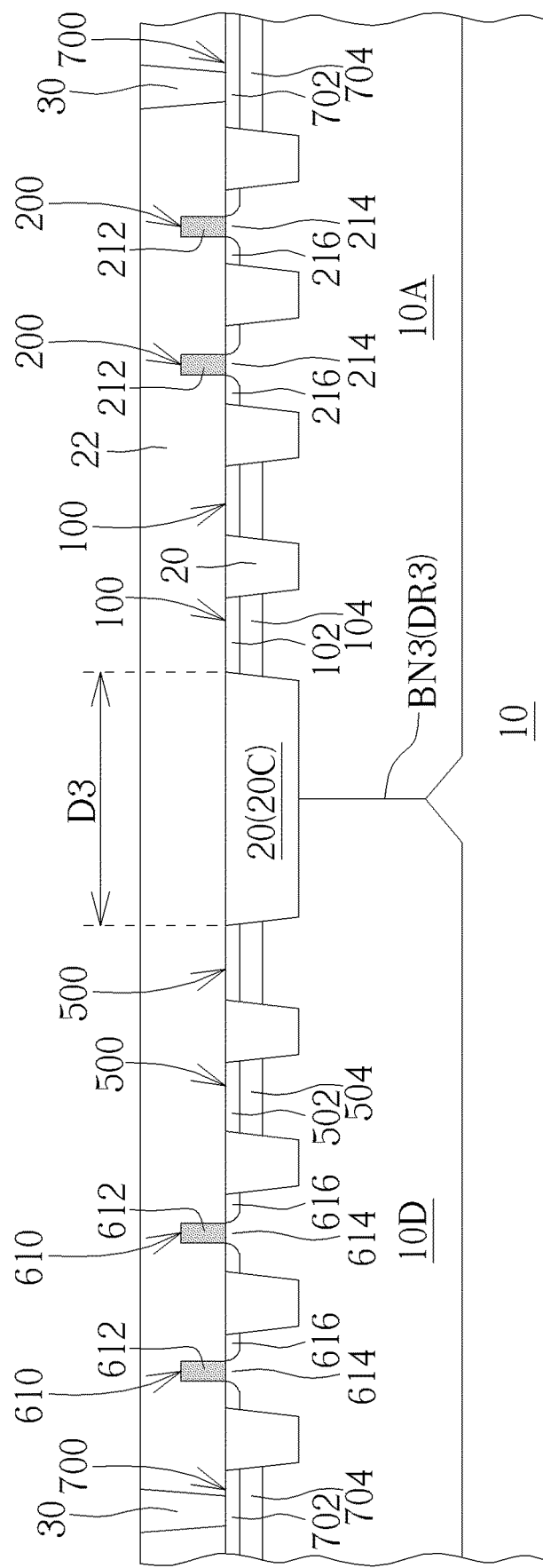

FIG. 2, FIG. 2A, and FIG. 2B are schematic diagrams illustrating a semiconductor structure according to a second embodiment of the present invention. FIG. 2 shows a top plan view of a portion of the semiconductor structure. FIG. 2A shows a cross-sectional view of a portion of the semiconductor structure along the direction X and through the first well region 10A, the second well region 10B, the third well region 10C, and the middle well region 10BB. FIG. 2B shows a cross-sectional view of a portion of the semiconductor structure along the direction Y and through the first well region 10A and the fourth well region 10D. For the sake of simplicity, some structures such as the active region 700, the interlayer dielectric layer 22, and the contact plugs 30 shown in FIG. 2A and FIG. 2B are not shown in FIG. 2. A difference between the first embodiment and the second embodiment is that, the second dummy structures 200, the fourth dummy structures 400, and the sixth dummy structures 600 in the first embodiment shown in FIG. 1, FIG. 1Am and FIG. 1B are replaced by the second dummy structures 210, the fourth dummy structures 410, and the sixth dummy structures 610 in the second embodiment shown in FIG. 2, FIG. 2A, and FIG. 2B.

In more detail, the second dummy structures 210 are disposed in the first well region 10A and respectively include a second dummy diffusion region 214, a second dummy portion 212 disposed on the second dummy diffusion region 214, and a metal silicide portion 216 disposed in the second dummy diffusion region 214 and at two sides of the second dummy portion 212. The fourth dummy structures 410 are disposed in the third well region 10C and respectively include a fourth dummy diffusion region 414, a fourth dummy portion 412 disposed on the fourth dummy diffusion region 414, and a metal silicide portion 416 disposed in the fourth dummy diffusion region 414 and at two sides of the fourth dummy portion 412. The sixth dummy structures 610 are disposed in the fourth well region 10C and respectively include a sixth dummy diffusion region 614, a sixth dummy portion 612 disposed on the sixth dummy diffusion region 614, and a metal silicide portion 616 disposed in the sixth dummy diffusion region 614 and at two sides of the sixth dummy portion 612.

According to an embodiment of the present invention, the second dummy diffusion regions 214, the fourth dummy diffusion regions 414, and the sixth dummy diffusion regions 614 may be formed through the same manufacturing process for forming the active regions 700, the first dummy structures 100, the third dummy structures 300, and the fifth dummy structures 500, and are separated from each other by the isolation structure 20. The manufacturing process may be referred to previous description, and will not be repeated herein. The second dummy portions 212, the fourth dummy portions 412, and the sixth dummy portions 612 may be formed through the same manufacturing process for forming the gate structures of the transistors (not shown) of the substrate 10. For example, the second dummy portions 212, the fourth dummy portions 412, and the sixth dummy portions 612 may be formed through a polysilicon gate manufacturing process, a gate-first metal gate manufacturing process, or a gate-last metal gate manufacturing process (also referred to as replacement metal gate process), but is not limited thereto. The second dummy portions 212, the fourth dummy portions 412, and the sixth dummy portions 612 may respectively include metal or polysilicon. The metal silicide portions 216, the metal silicide portions 416, and the metal silicide portions 616 may respectively include cobalt silicide (CoSi), titanium silicide (TiSi), nickel silicide (NiSi), or platinum silicide (PtSi), but are not limited thereto. One feature of the second embodiment is that, the second dummy portions 212, the fourth dummy portions 412, and the sixth dummy portions 612 respectively disposed on the second dummy diffusion regions 214, the fourth dummy diffusion regions 414, and the sixth dummy diffusion regions 614 may help to provide a pattern density similar to the gate pattern density of other device regions of the substrate 10 during the gate manufacturing process.

It should be noted that the fourth dummy structure 410 shown in FIG. 2, FIG. 2A and FIG. 2B is only an example. In other embodiments, the fourth dummy structures 400 may be used in the third well region 10C in FIG. 2, FIG. 2A and FIG. 2B instead of the fourth dummy structures 410.

Figure 3:
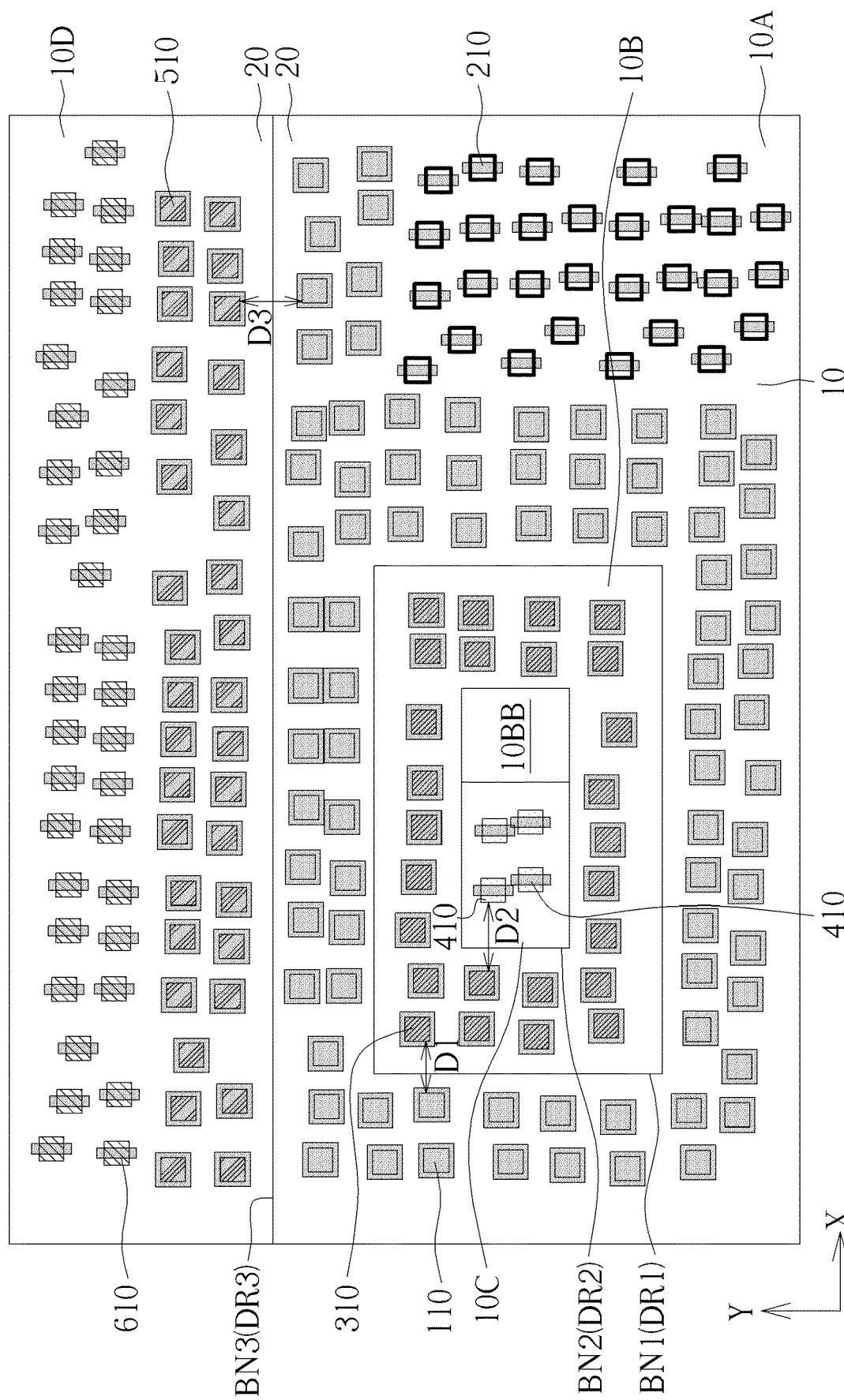
Figure 3A:
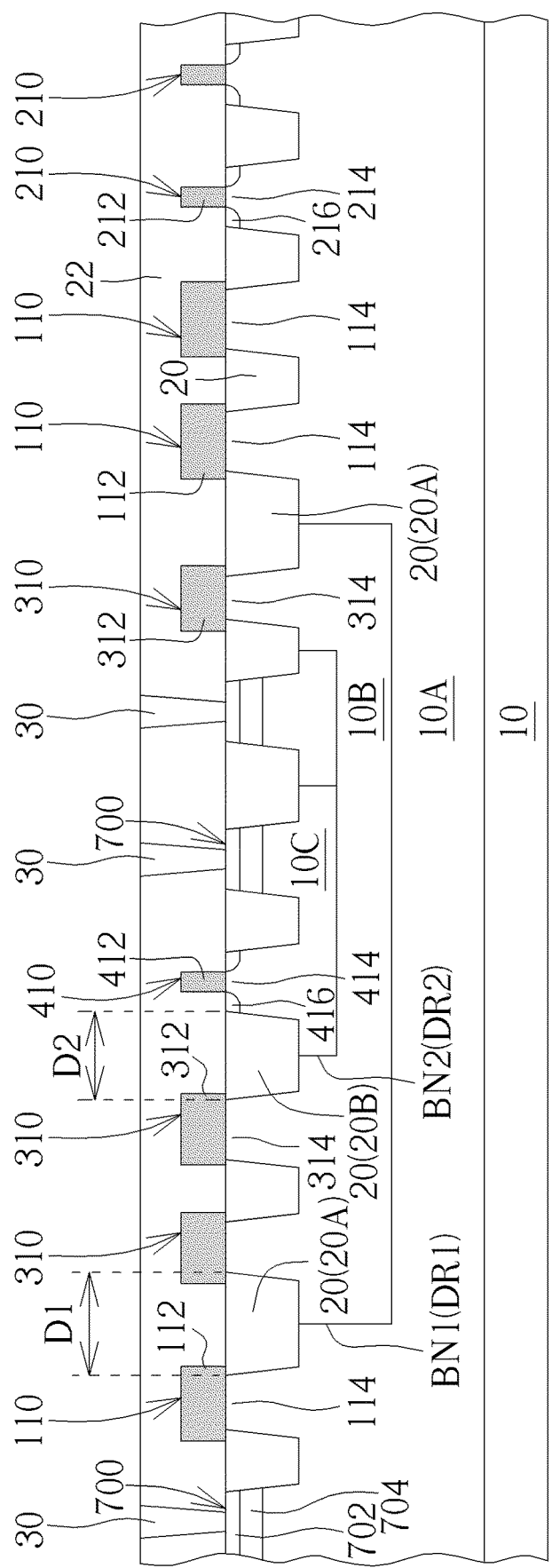
Figure 3B:
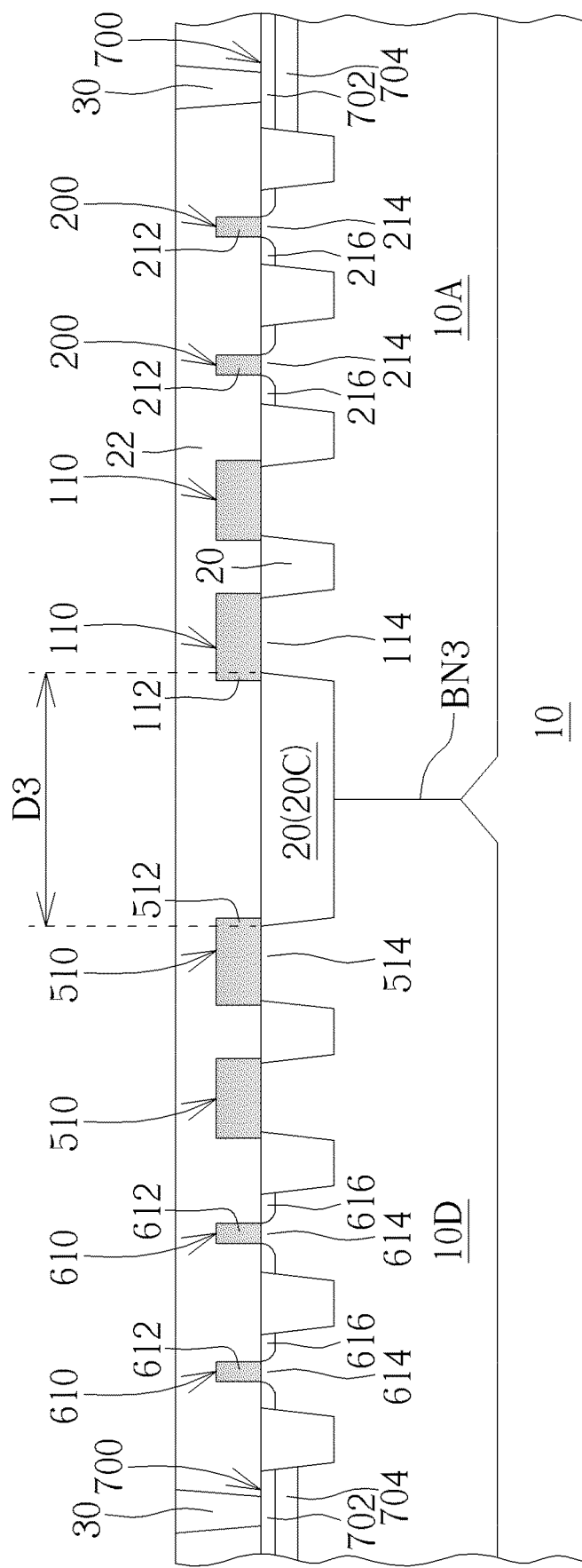

FIG. 3, FIG. 3A, and FIG. 3B are schematic diagrams illustrating a semiconductor structure according to a third embodiment of the present invention. FIG. 3 shows a top plan view of a portion of the semiconductor structure. FIG. 3A shows a cross-sectional view of a portion of the semiconductor structure along the direction X and through the first well region 10A, the second well region 10B, the third well region 10C, and the middle well region 10BB. FIG. 3B shows a cross-sectional view of a portion of the semiconductor structure along the direction Y and through the first well region 10A and the fourth well region 10D. For the sake of simplicity, some structures such as the active region 700, the interlayer dielectric layer 22, and the contact plugs 30 shown in FIG. 3A and FIG. 3B are not shown in FIG. 3. A difference between the second embodiment and the third embodiment is that, the first dummy structures 100, the third dummy structures 300, and the fifth dummy structures 500 in the second embodiment shown in FIG. 2, FIG. 2A, and FIG. 2B are replaced by the first dummy structures 110, the third dummy structures 310, and the fifth dummy structures 510 in the third embodiment shown in FIG. 3, FIG. 3A and FIG. 3B.

In more detail, the first dummy structures 110 respectively include a first dummy diffusion region 114 and a first dummy portion 112 disposed on the first dummy diffusion region 114. The third dummy structures 310 respectively include a third dummy diffusion region 314 and a third dummy portion 312 disposed on the third dummy diffusion region 314. The fifth dummy structures 510 respectively include a fifth dummy diffusion region 514 and a fifth dummy portion 512 disposed on the fifth dummy diffusion region 514. The first dummy portions 112, the third dummy portions 312, and the fifth dummy portions 512 may be formed through the same manufacturing process for forming the gate structures of the transistors (not shown) on the substrate 10. For example, first dummy portions 112, the third dummy portions 312, and the fifth dummy portions 512 may be formed through a polysilicon gate manufacturing process, a gate-first metal gate manufacturing process, or a gate-last metal gate manufacturing process (also referred to as replacement metal gate process), but is not limited thereto. The first dummy portions 112, the third dummy portions 312, and the fifth dummy portions 512 may respectively include metal or polysilicon. One feature of the third embodiment is that, the regions having the first dummy portions 112, the third dummy portions 312, and the fifth dummy portions 512 may also have proper pattern densities similar to the gate pattern density of other device regions of the substrate 10 during the gate manufacturing process. Therefore, the process window may be further improved. Another feature of the third embodiment is that, the first dummy diffusion regions 114, the third dummy diffusion regions 314, and the fifth dummy diffusion regions 514 are completely covered by the first dummy portions 112, the third dummy portions 312, and the fifth dummy portions 512, respectively, and are not exposed. Accordingly, none of any metal silicide portion may be formed in the first dummy diffusion regions 114, the third dummy diffusion regions 314, and the fifth dummy diffusion regions 514, so that the through-well leakage caused by the free carriers from the metal silicide portion may be prevented.

Figure 4:
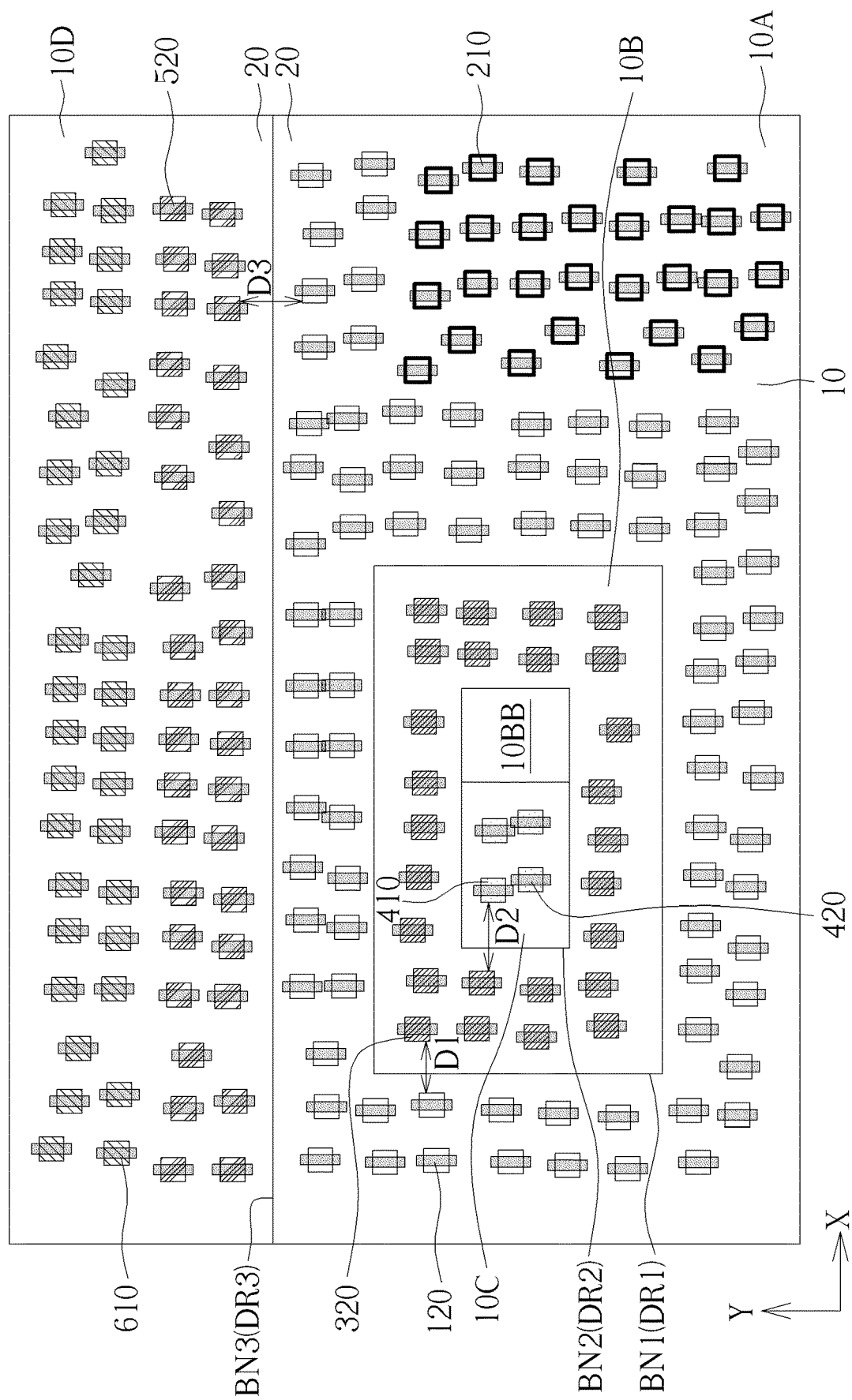
Figure 4A:
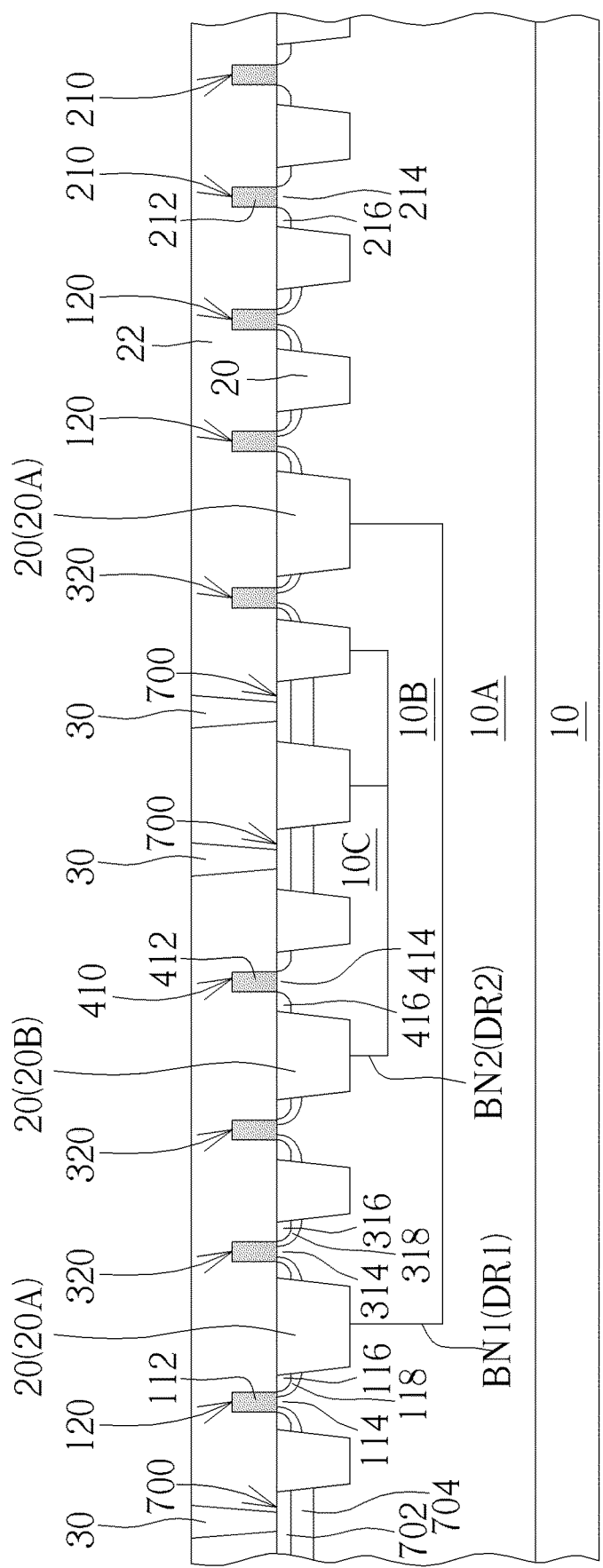
Figure 4B:
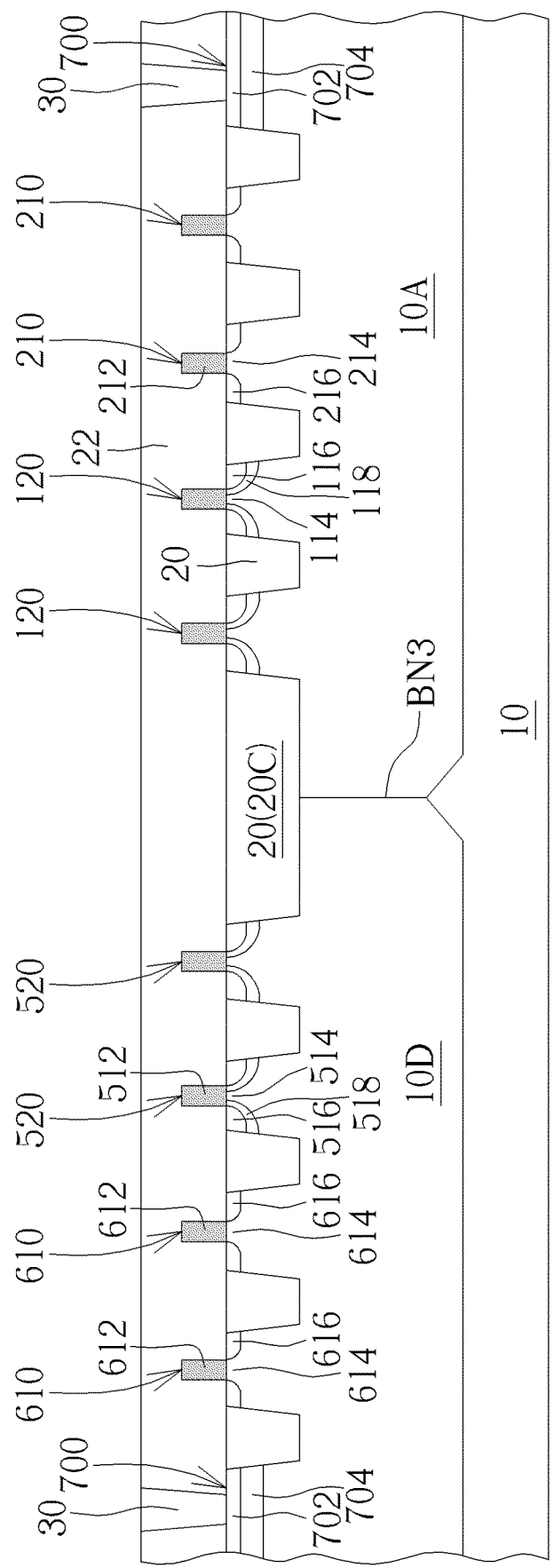

FIG. 4, FIG. 4A, and FIG. 4B are schematic diagrams illustrating a semiconductor structure according to a fourth embodiment of the present invention. FIG. 4 shows a top plan view of a portion of the semiconductor structure. FIG. 4A shows a cross-sectional view of a portion of the semiconductor structure along the direction X and through the first well region 10A, the second well region 10B, the third well region 10C, and the middle well region 10BB. FIG. 4B shows a cross-sectional view of a portion of the semiconductor structure along the direction Y and through the first well region 10A and the fourth well region 10D. For the sake of simplicity, some structures such as the active region 700, the interlayer dielectric layer 22, and the contact plugs 30 shown in FIG. 4A and FIG. 4B are not shown in FIG. 4. A difference between the second embodiment and the fourth embodiment is that, the first dummy structures 100, the third dummy structures 300, and the fifth dummy structures 500 in the second embodiment shown in FIG. 2, FIG. 2A, and FIG. 2B are replaced by the first dummy structures 120, the third dummy structures 320, and the fifth dummy structures 520 in the fourth embodiment shown in FIG. 4, FIG. 4A, and FIG. 4B.

In more detail, the first dummy structures 120 respectively include a first dummy diffusion region 114, a first dummy portion 112 disposed on the first dummy diffusion region 114, a metal silicide portion 116 disposed in the first dummy diffusion region 114 and at two sides of the first dummy portion 112, and a first doped region 118 disposed in the first dummy diffusion region 114 and encompassing the metal silicide portion 116 to prevent the metal silicide portion 116 from being in direct contact with the first well region 10A. The third dummy structures 320 respectively include a third dummy diffusion region 314, a third dummy portion 312 disposed on the third dummy diffusion region 314, a metal silicide portion 316 disposed in the third dummy diffusion region 314 and at two sides of the third dummy portion 312, and a third doped region 318 disposed in the third dummy diffusion region 314 and encompassing the metal silicide portion 316 to prevent the metal silicide portion 316 from being in direct contact with the second well region 10B. The fifth dummy structures 520 respectively include a fifth dummy diffusion region 514, a fifth dummy portion 512 disposed on the fifth dummy diffusion region 514, a metal silicide portion 516 disposed in the fifth dummy diffusion region 514 and at two sides of the fifth dummy portion 512, and a fifth doped region 518 disposed in the fifth dummy diffusion region 514 and encompassing the metal silicide portion 516 to prevent the metal silicide portion 516 from being in direct contact with the fourth well region 10D.

One feature of the fifth embodiment is that, the first dummy structures 120, the third dummy structures 320, and the fifth dummy structures 520 near the junction BN1, the junction BN2, or the junction BN3 are respectively provided with a first doped region 118 to encompass the metal silicide portion 116, a third doped region 318 to encompass the metal silicide portion 316, and a fifth doped region 518 to encompass the metal silicide portion 516. The doped regions may increase the injection barrier for the free carriers formed in the metal silicide portions 116, 316, 516 to be injected into the well region. Therefore, the through-well leakage may be reduced.

Figure 5:
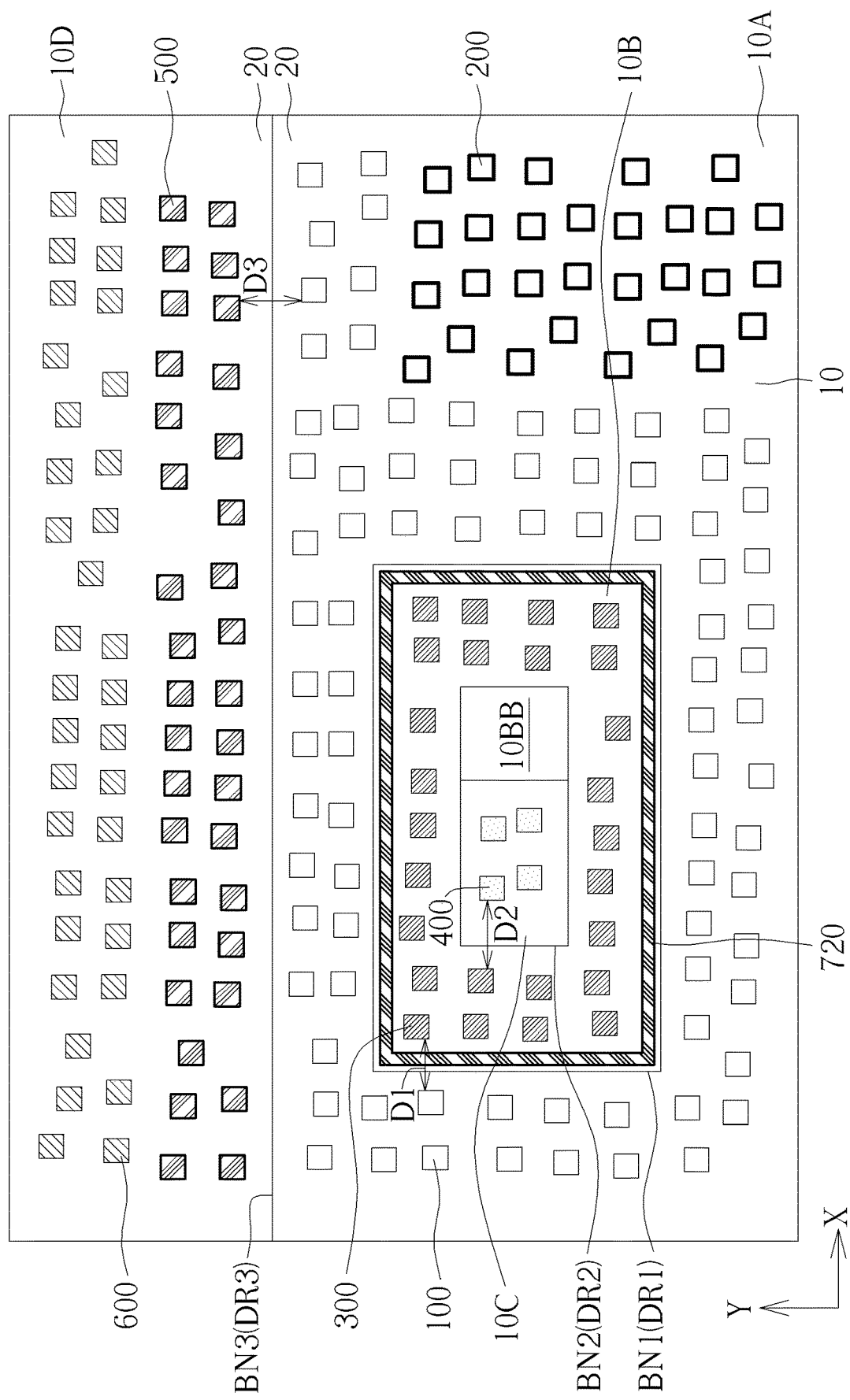
Figure 5A:
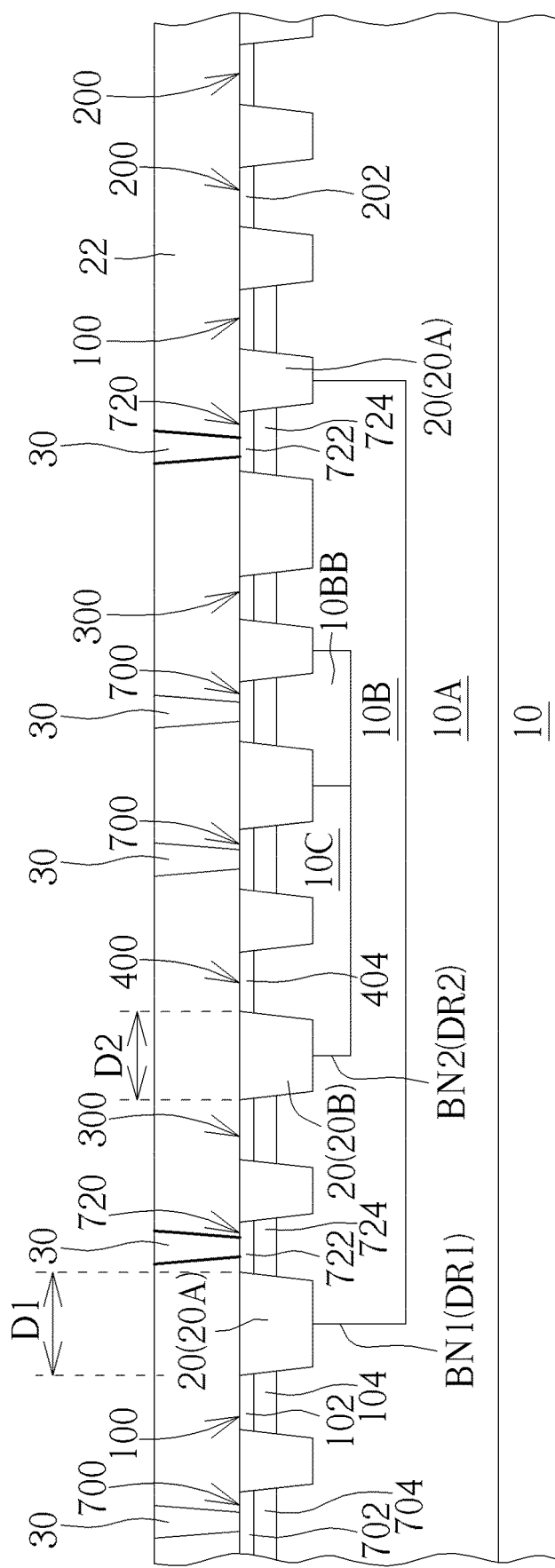

FIG. 5 and FIG. 5A are schematic diagrams illustrating a semiconductor structure according to a fifth embodiment of the present invention. FIG. 5 shows a top plan view of a portion of the semiconductor structure. FIG. 5A shows a cross-sectional view of a portion of the semiconductor structure along the direction X and through the first well region 10A, the second well region 10B, the third well region 10C, and the middle well region 10BB. For the sake of simplicity, some structures such as the active region 700, the interlayer dielectric layer 22, and the contact plugs 30 shown in FIG. 5A are not shown in FIG. 5.

A difference between the first embodiment and the fifth embodiment is that, in the fifth embodiment as shown in FIG. 5, a well pick-up region 720 may be disposed in the second well region 10B and between the first dummy structures 100 and the third dummy structures 300. The well pick-up region 720 may have a closed-ring shape that surrounds the peripheral portion of the second well region 10B. As shown in FIG. 5A, the well pick-up region 720 may include a conductive region 722 and a doped region 724 located under the conductive region 722. The doped region 724 is between the conductive region 722 and the second well region 10B, so that the conductive region 722 does not directly contact the second well region 10B. According to an embodiment of the invention, the conductive region 722 includes a metal silicide, such as cobalt silicide (CoSi), titanium silicide (TiSi), nickel silicide (NiSi), or platinum silicide (PtSi), but is not limited thereto. The doped region 724 may include dopants of the second conductive type and therefore has the second conductive type (such as N-type) as the second well region 10B. The doping concentration of the doped region 724 may be greater than the doping concentration of the second well region 10B. The conductive region 722 of the well pick-up region 720 is electrically connected to at least one of the contact plugs 30. An external voltage may be applied to the well pick-up region 720 through the contact plug 30 to control the electric field of in the second well region 10B.

In summary, the semiconductor structure provided by the present invention includes dummy structures arranged along the junction between the well regions having different conductive types, wherein a doped region is particularly formed in the dummy structure having a conductive region (such as a metal silicide) and located between the conductive region and the well region where the conductive region is formed. The doped region has the same conductive type as the well region where the conductive region is formed, and may modulate the band diagram to increase the injection barrier for the free carriers (such as holes) formed in the conductive region to be injected into the well region. Accordingly, the through-well leakage may be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate comprising a first well region of a first conductive type, a second well region of a second conductive type, and a junction between the first well region and the second well region, wherein the first conductive type and the second conductive type are complementary; and
   an isolation structure formed in the substrate to define a plurality of first dummy structures and second dummy structures and at least a first active region in the first well region, wherein the first dummy structures are adjacent to the junction and respectively comprise a first metal silicide region and a first doped region of the first conductive type with the first doped region of the first conductive type being between the first metal silicide region and the first well region, the first dummy structures are between the second dummy structures and the junction between the first well region and the second well region, and wherein the second dummy structures respectively comprise a second metal silicide region that is in direct contact with the first well region.

2. The semiconductor structure according to claim 1, wherein the first dummy structures and the second dummy structures are electrically floating.

3. The semiconductor structure according to claim 1, further comprising a plurality of third dummy structures and at least a second active region defined in the second well by the isolation structure, wherein the third dummy structures are adjacent to the junction and respectively comprise a third metal silicide region and a third doped region of the second conductive type with the third doped region of the second conductive type being between the third metal silicide region and the second well region.

4. The semiconductor structure according to claim 3, further comprising a plurality of fourth dummy structures defined in the second well by the isolation structure and between the third dummy structures and the second active region, wherein the fourth dummy structures respectively comprise a fourth metal silicide region that is in direct contact with the second well region.

5. The semiconductor structure according to claim 3, wherein a distance between the first dummy structures and the third dummy structures is between 1.6 um and 4.6 um.

6. The semiconductor structure according to claim 1, further comprising a contact plug disposed on the first active region and electrically connected to the first active region.

7. The semiconductor structure according to claim 1, further comprising:
   a third well region of the second conductive type formed in the first well region; and
   a plurality of fifth dummy structures defined in the third well region by the isolation structure, wherein the fifth dummy structures respectively comprise a fifth metal silicide region and a fifth doped region of the second conductive type with the fifth doped region of the second conductive type being between the fifth metal silicide region and the third well region.

8. The semiconductor structure according to claim 7, wherein the third well region is surrounded by the first dummy structures from a top view.

* * * * *